United States Patent
Chung et al.

(10) Patent No.: US 12,402,511 B2
(45) Date of Patent: *Aug. 26, 2025

(54) ORGANIC LIGHT-EMITTING DISPLAY DEVICE

(71) Applicant: SAMSUNG DISPLAY CO., LTD., Yongin-si (KR)

(72) Inventors: Jin-Koo Chung, Yongin-si (KR); Sang-Hoon Yim, Yongin-si (KR); Chan-Young Park, Yongin-si (KR); Jun-Ho Choi, Yongin-si (KR); Seong-Min Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 200 days.

This patent is subject to a terminal disclaimer.

(21) Appl. No.: 16/727,563

(22) Filed: Dec. 26, 2019

(65) Prior Publication Data

US 2020/0135827 A1 Apr. 30, 2020

Related U.S. Application Data

(60) Continuation of application No. 15/467,780, filed on Mar. 23, 2017, now abandoned, which is a division of
(Continued)

(30) Foreign Application Priority Data

Apr. 21, 2011 (KR) .................. 10-2011-0037348

(51) Int. Cl.
*H10K 59/65* (2023.01)
*H10K 59/121* (2023.01)
(Continued)

(52) U.S. Cl.
CPC .......... *H10K 59/65* (2023.02); *H10K 59/121* (2023.02); *H10K 59/1213* (2023.02);
(Continued)

(58) Field of Classification Search
CPC .............. H01L 27/3234; H01L 27/326; H01L 27/3227; H01L 27/3255; H01L 25/167;
(Continued)

(56) References Cited

U.S. PATENT DOCUMENTS 8,569,773 B2 10/2013 Yim et al.
8,796,702 B2 * 8/2014 Kim ..................... H01L 27/326
257/88
(Continued)

FOREIGN PATENT DOCUMENTS

JP 2006-128241 5/2006
JP 2010-230797 10/2010
(Continued)

OTHER PUBLICATIONS

Hirsch, M., et al.; BiDi Screen: A Thin, Depth-Sensing LCD for 3D Interaction using Light Fields; www.bidiscreen.com; United States. MIT Media Lab, Sep. 12, 2009.

*Primary Examiner* — Yu Chen
(74) *Attorney, Agent, or Firm* — KILE PARK REED & HOUTTEMAN PLLC

(57) ABSTRACT

Embodiments may disclose an organic light-emitting display device including a first substrate including a pixel area emitting light in a first direction, and a transmittance area that is adjacent to the pixel area and transmits external light; a second substrate facing the first substrate and encapsulating a pixel on the first substrate; an optical pattern array on the first substrate or the second substrate to correspond to the transmittance area, the optical pattern array being configured to transmit or block external light depending on the trans-
(Continued)

mittance area according to a coded pattern; and a sensor array corresponding to the optical pattern array, the sensor array being arranged in a second direction that is opposite to the first direction in which the light is emitted, the second array receiving the external light passing through the optical pattern array.

18 Claims, 14 Drawing Sheets

Related U.S. Application Data application No. 14/511,249, filed on Oct. 10, 2014, now Pat. No. 9,620,576, which is a division of application No. 13/137,977, filed on Sep. 22, 2011, now Pat. No. 8,860,027.

(51) Int. Cl.
*H10K 59/126* (2023.01)
*H10K 59/35* (2023.01)
*H10K 59/40* (2023.01)
*H10K 59/80* (2023.01)
*H10K 59/82* (2023.01)

(52) U.S. Cl.
CPC ........... *H10K 59/126* (2023.02); *H10K 59/35* (2023.02); *H10K 59/40* (2023.02); *H10K 59/82* (2023.02); *H10K 59/8792* (2023.02); *H10K 59/80518* (2023.02); *H10K 59/87* (2023.02)

(58) Field of Classification Search
CPC .................... H01L 25/18; G06F 3/017; H10K 59/12–1315; H10K 59/35–353; H10K 59/40; H10K 59/60; H10K 59/65; H10K 59/8791; H10K 59/8792; H10K 59/90
See application file for complete search history.

(56) References Cited

U.S. PATENT DOCUMENTS

| | | | |
|---|---|---|---|
| 8,860,027 B2 | 10/2014 | Chung et al. | |
| 2006/0011913 A1* | 1/2006 | Yamazaki | H01L 27/1214 257/53 |
| 2006/0024855 A1* | 2/2006 | Sano | H01L 51/0021 438/34 |
| 2008/0165267 A1 | 7/2008 | Cok | |
| 2009/0220679 A1* | 9/2009 | Kumagai | H01L 27/3246 427/64 |
| 2010/0084642 A1 | 4/2010 | Hanari | |
| 2010/0098323 A1 | 4/2010 | Agrawal et al. | |
| 2010/0102301 A1* | 4/2010 | Yang | H10K 59/126 257/40 |
| 2010/0148163 A1 | 6/2010 | Im et al. | |
| 2010/0149077 A1 | 6/2010 | Asano | |
| 2010/0155578 A1 | 6/2010 | Matsumoto | |
| 2011/0102308 A1 | 5/2011 | Nakamura et al. | |
| 2011/0220922 A1 | 9/2011 | Kim et al. | |
| 2012/0092302 A1 | 4/2012 | Imai et al. | |

FOREIGN PATENT DOCUMENTS

| | | |
|---|---|---|
| KR | 10-2003-0038883 | 5/2003 |
| KR | 10-2007-0021568 | 2/2007 |
| KR | 20-2008-0003681 | 9/2008 |
| KR | 10-2011-0103735 | 9/2011 |
| WO | 2010150573 | 12/2010 |

* cited by examiner

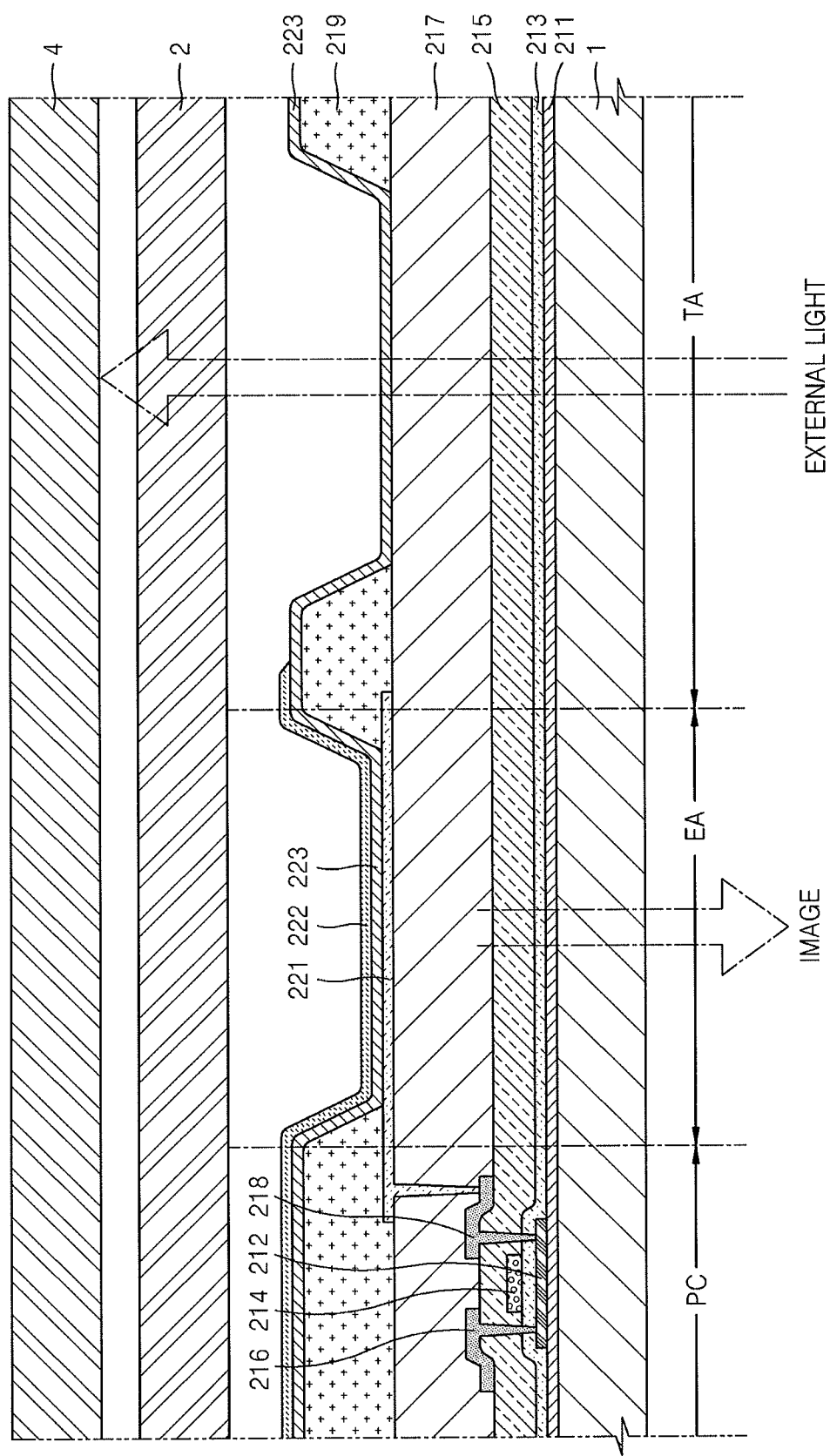

ORGANIC LIGHT-EMITTING DISPLAY DEVICE

CROSS-REFERENCE TO RELATED PATENT APPLICATIONS

This is a continuation application based on currently pending U.S. patent application Ser. No. 15/467,780, filed on Mar. 23, 2017, the disclosure of which is incorporated herein by reference in its entirety. U.S. patent application Ser. No. 15/467,780 is a divisional application of U.S. patent application Ser. No. 14/511,249, filed Oct. 10, 2014, now U.S. Pat. No. 9,620,576, issued Apr. 11, 2017, the disclosure of which is incorporated herein by reference in its entirety. U.S. patent application Ser. No. 14/511,249 is a divisional of U.S. patent application Ser. No. 13/137,977, filed Sep. 22, 2011, now U.S. Pat. No. 8,860,027, issued Oct. 14, 2014, the disclosure of which is incorporated herein by reference in its entirety. U.S. Pat. No. 8,860,027 claims priority benefit of Korean Patent Application No. 10-2011-0037348, filed on Apr. 21, 2011, in the Korean Intellectual Property Office, the disclosure of which is incorporated herein by reference in its entirety for all purposes.

BACKGROUND

1. Field of the Invention

Embodiments relate to an organic light-emitting display device. More particularly, embodiments relate to an organic light-emitting display device as interactive media.

2. Description of the Related Art

Interactive media is media in which a user and a mechanical device interact with each other. In interactive media, the user and the mechanical device interact with each other according to specific roles. For example, the display device in a display mode may provide an image to a user, and when the user makes a gesture in capture mode, the display device captures and recognizes the gesture. Then, the display device realizes a function corresponding to the gesture.

SUMMARY

Embodiments may be directed to an organic light-emitting display device including a first substrate including a pixel area emitting light in a first direction, and a transmittance area that is adjacent to the pixel area and transmits external light; a second substrate facing the first substrate and encapsulating a pixel defined on the first substrate; an optical pattern array formed on the first substrate or the second substrate to correspond to the transmittance area, the optical pattern array being configured to transmit or block external light depending on the transmittance area according to a coded pattern; and a sensor array corresponding to the optical pattern array, the sensory array being arranged in a second direction that is opposite to the first direction in which the light is emitted, the sensory array receiving the external light passing through the optical pattern array.

The organic light-emitting display device may further include a pixel circuit unit on the first substrate, including one or more thin film transistors (TFTs), and positioned in the pixel area; a first insulating layer covering at least the pixel circuit unit; a first electrode formed on the first insulating layer so as to be electrically connected to the pixel circuit unit, the first electrode being positioned in the pixel area and being adjacent to the pixel circuit unit so as not to overlap with the pixel circuit unit and including a transparent conductive material; a second insulating layer covering at least a portion of the first electrode; a second electrode capable of reflecting light so as to emit light toward the first electrode, the second electrode facing the first electrode and being positioned in the pixel area; and an organic layer interposed between the first electrode and the second electrode and including an emission layer (EML).

The second insulating layer may include an opening at a position corresponding to the transmittance area.

The second electrode may include at least one metal of Ag, Mg, Al, Pt, Pd, Au, Ni, Nd, Ir, Cr, Li, Ca, Yb, and alloys thereof.

The pixel may include a plurality of sub-pixels, and transmittance areas of two adjacent sub-pixels may be connected to each other.

The optical pattern array may include a transmittance pattern by which the external light is transmitted; and a light-blocking pattern blocking the external light, wherein the light-blocking pattern is implemented when a light-blocking layer is on the second substrate corresponding to the transmittance area.

The sensor array may be formed on side portions of the second substrate and may receive the external light passing through the transmittance pattern of the optical pattern array.

The light-blocking layer may include at least one metal of Ag, Mg, Al, Pt, Pd, Au, Ni, Nd, Ir, Cr, Li, Ca, Mo, and alloys thereof or may include a black matrix material.

The optical pattern array may include a transmittance pattern by which the external light is transmitted; and a light-blocking pattern blocking the external light, wherein the light-blocking pattern is implemented when the second electrode capable of reflecting light is also formed in the transmittance area.

The organic light-emitting display device may further include a pixel circuit unit on the first substrate, including one or more TFTs, and positioned in the pixel area; a first insulating layer covering at least the pixel circuit unit; a first electrode on the first insulating layer so as to be electrically connected to the pixel circuit unit, the first electrode being positioned in the pixel area and overlapping with the pixel circuit unit so as to cover the pixel circuit unit, the first electrode including a reflective layer that is capable of reflecting light and including a conductive material; a second insulating layer covering at least a portion of the first electrode; a second electrode capable of transmitting light so as to emit light in an opposite direction in which the first electrode reflects light, the second electrode facing the first electrode; and an organic layer interposed between the first electrode and the second electrode and including an EML.

The second insulating layer may include an opening at a position corresponding to the transmittance area. The reflective layer may include at least one metal of Ag, Mg, Al, Pt, Pd, Au, Ni, Nd, Ir, Cr, Li, Ca, Mo, and alloys thereof.

The pixel may include the transmittance area, and a plurality of the pixel areas that are separate from each other by having the transmittance area there between.

The optical pattern array may include a transmittance pattern by which the external light is transmitted; and a light-blocking pattern blocking the external light, wherein the light-blocking pattern is implemented when a light-blocking layer capable of blocking light is on an insulating layer formed in the transmittance area.

The sensor array may be on side portions of the first substrate and receives the external light passing through the transmittance pattern of the optical pattern array.

The light-blocking layer may include at least one metal of Ag, Mg, Al, Pt, Pd, Au, Ni, Nd, Ir, Cr, Li, Ca, Mo, and alloys thereof or may include a black matrix material.

BRIEF DESCRIPTION OF THE DRAWINGS

The above and other features will become more apparent by describing in detail exemplary embodiments thereof with reference to the attached drawings in which:

FIGS. 5 through 7 are cross-sectional views of the organic light-emitting display device of FIG. 4A, taken along a line I-I';

DETAILED DESCRIPTION

Example embodiments will now be described more fully hereinafter with reference to the accompanying drawings; however, they may be embodied in different forms and should not be construed as limited to the embodiments set forth herein.

While such terms as "first," "second," etc., may be used to describe various components, such components must not be limited to the above terms. The above terms are used only to distinguish one component from another.

The terms used in the present specification are merely used to describe particular embodiments, and are not intended to limit present embodiments. An expression used in the singular encompasses the expression in the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Figure 1:
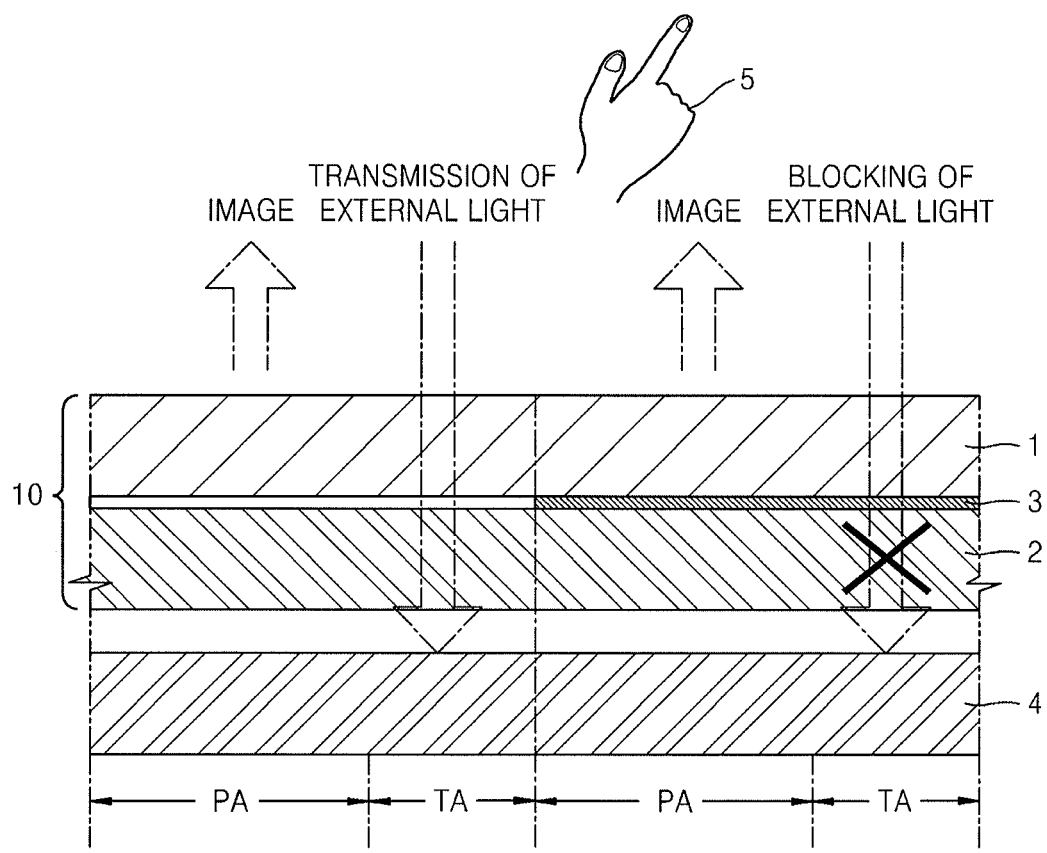
FIG. 1 is a cross-sectional view illustrating a portion of an organic light-emitting display device according to an embodiment.

FIG. 1 is a cross-sectional view illustrating a portion of an organic light-emitting display device according to an embodiment.

Referring to FIG. 1, the organic light-emitting display device includes a panel 10 that includes a first substrate 1 having a pixel area PA for realizing an image in a first direction and a transmittance area TA via which external light is transmitted, and a second substrate 2 encapsulating the first substrate 1.

In the organic light-emitting display device, the external light passes through the first substrate 1 and the second substrate 2 and then is received by a sensor array 4 positioned in an opposite side of the first direction in which the image is realized.

A user may view the image realized on the organic light-emitting display device in the first direction, and when the user makes a gesture 5, the sensor array 4 may capture the gesture 5 of the user, which is projected after passing through the panel 10.

The panel 10 includes a coded optical pattern array 3. The optical pattern array 3 may be formed on the first substrate 1 or the second substrate 2. In FIG. 1, for convenience, the optical pattern array 3 is illustrated between the first substrate 1 and the second substrate 2. The optical pattern array 3 forms a coded pattern by allowing a predetermined transmittance area TA to be blocked or not to be blocked.

The sensor array 4 may capture the gesture 5 of the user via the optical pattern array 3 having the coded pattern, and may extract three-dimensional (3D) information by analyzing captured images using software.

Figure 2:
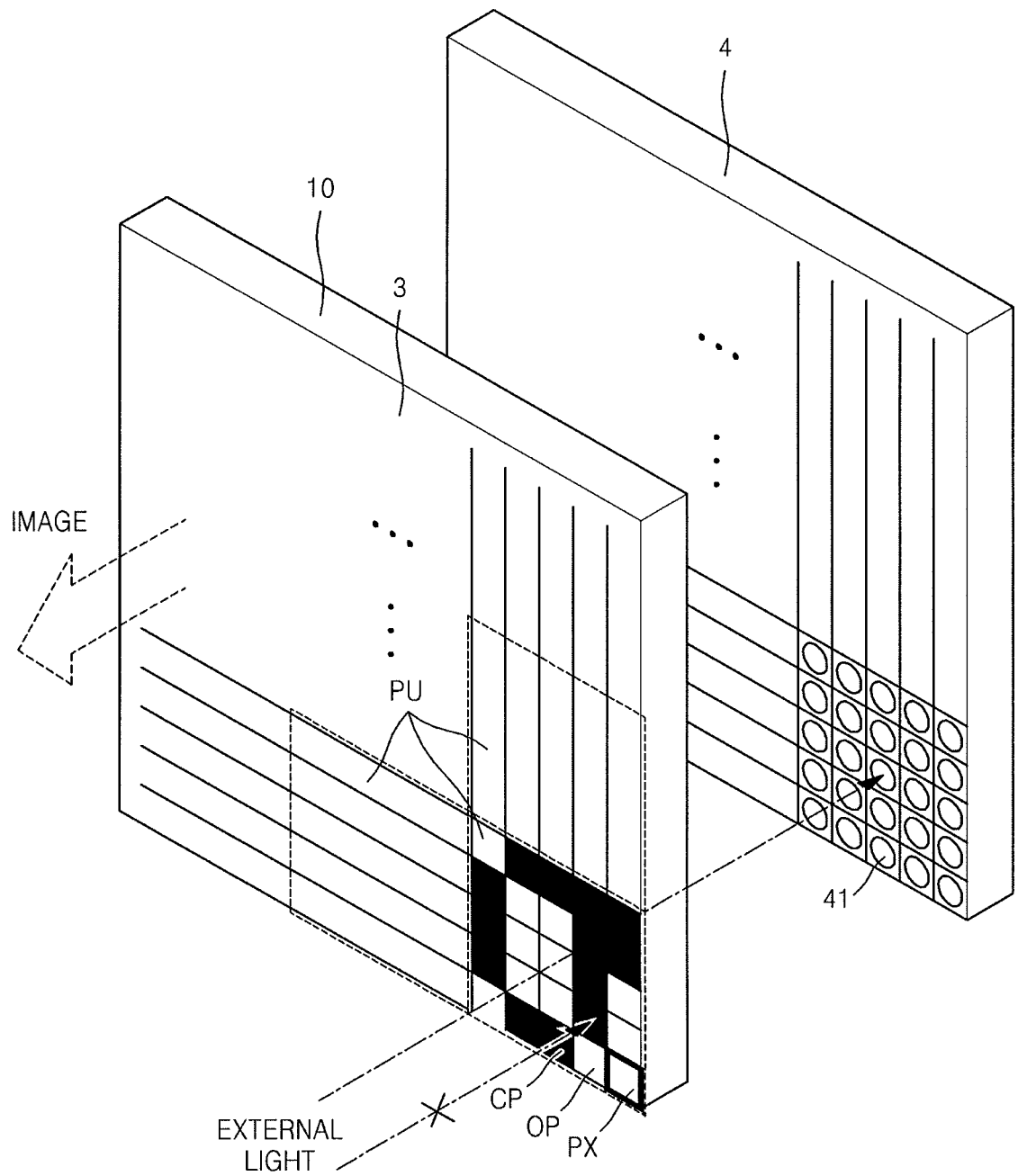
FIG. 2 is a perspective view illustrating the organic light-emitting display device of FIG. 1.
Figure 3A:
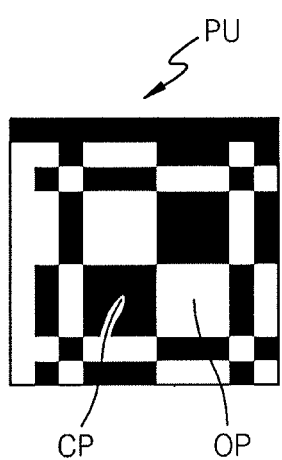
FIG. 3A through 3D illustrates various optical pattern units included in an optical pattern array.
Figure 3B:
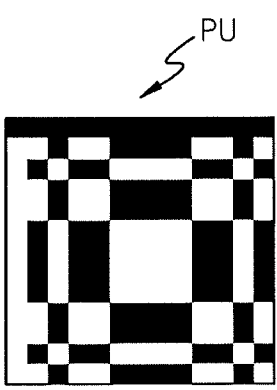
Figure 3C:
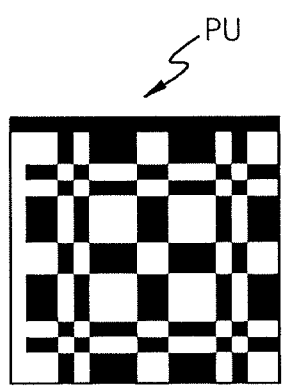
Figure 3D:
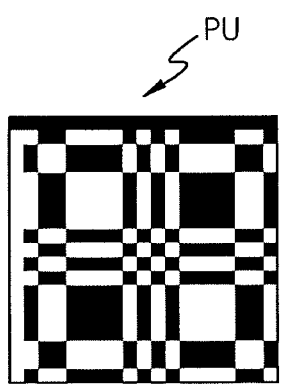

FIG. 2 is a perspective view illustrating the organic light-emitting display device of FIG. 1. In FIG. 2, in order to particularly describe an optical pattern unit PU, the optical pattern unit PU is illustrated on a top surface of the panel 10 so as to be clearly shown.

Referring to FIG. 2, the panel 10 of the organic light-emitting display device is partitioned into a plurality of pixels PX, and the optical pattern array 3 is formed to have an optical pattern unit PU having a specific pattern with respect to a group of pixels PX. Hence, the optical pattern unit PU having the specific pattern is repeatedly and continuously formed in the panel 10, and thus forms the optical pattern array 3.

An optical pattern is divided into a transmittance pattern OP via which external light is transmitted and a light-blocking pattern CP for blocking the external light. The present embodiment is characterized in that the transmittance pattern OP and the light-blocking pattern CP are realized by directly disposing light-blocking films 31 and 33 on the organic light-emitting display device. Thus, it is not necessary to display a separate optical mask pattern and to have a backlight, so that the organic light-emitting display device may be large and slim. A method of realizing the transmittance pattern OP and the light-blocking pattern CP will be described in detail at a later time.

The sensor array 4 is formed of sensors 41 each corresponding to a pixel PX and an optical pattern. Here, each sensor 41 may be an imaging device capable of capturing an image by receiving light. For example, each sensor 41 may be a charge-coupled device (CCD) sensor or a complementary metal-oxide-semiconductor (CMOS) sensor.

The sensor array 4 receives incident light by using the optical pattern array 3 as an optical mask. For example, the sensor 41 corresponding to the transmittance pattern OP may capture an image by receiving light, but the sensors 41 corresponding to the light-blocking pattern CP do not receive incident light, so that the sensors 41 corresponding to the light-blocking pattern CP may not capture an image or may obtain only a black image.

The sensor array 4 may capture images according to optical patterns, respectively. A signal processing unit (not shown) may obtain a 3D image by processing the images obtained from the sensor array 4.

FIG. 3 illustrates various optical pattern units PU included in the optical pattern array 3.

Referring to FIG. 3, a case (a) indicates an optical pattern unit PU with respect to a group of 11×11 pixels PX in total. A case (b) indicates an optical pattern unit PU with respect to a group of 13×13 pixels PX in total, and a case (c) indicates an optical pattern unit PU with respect to a group of 17×17 pixels PX in total. A case (d) indicates an optical pattern unit PU with respect to a group of 19×19 pixels PX in total.

In FIG. 3, a black portion indicates a light-blocking pattern CP that blocks light entering the sensor array 4, and a white portion indicates a transmittance pattern OP that does not block light entering the sensor array 4.

According to the present embodiment, as described in FIG. 2, the optical pattern units PU of FIG. 3 are repeatedly formed in the panel 10, thereby forming the optical pattern array 3. Various optical pattern shapes are coded to allow the signal processing unit (not shown) to easily obtain 3D information, and shapes and functions of the coded optical patterns are well known according to the related art.

Hereinafter, how the transmittance pattern OP and the light-blocking pattern CP of the optical pattern array 3 are realized in the organic light-emitting display device will be described in detail.

Figure 4A:
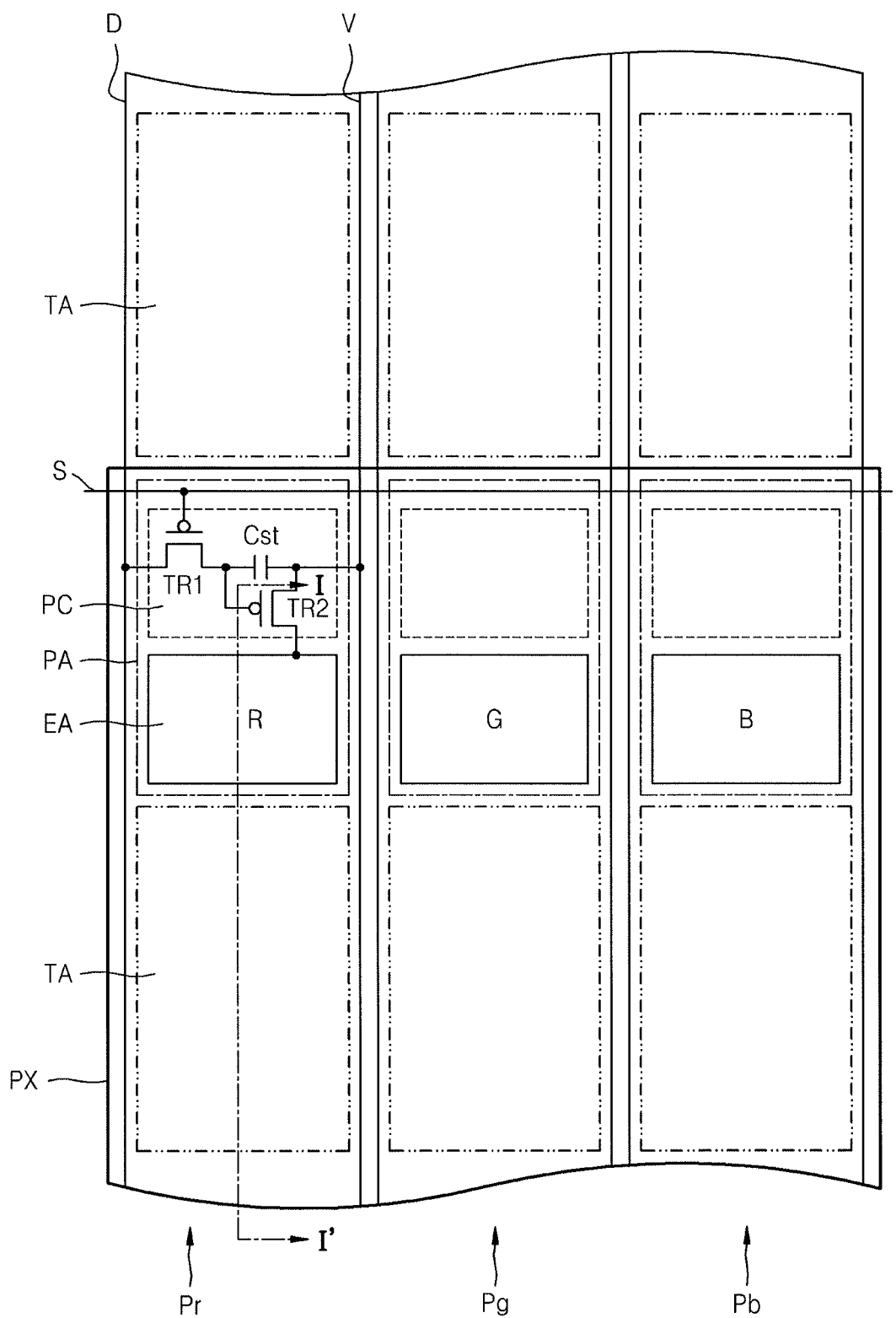
FIGS. 4A and 4B are diagrams illustrating configurations of a pixel of the organic light-emitting display device, according to an embodiment.
Figure 4B:
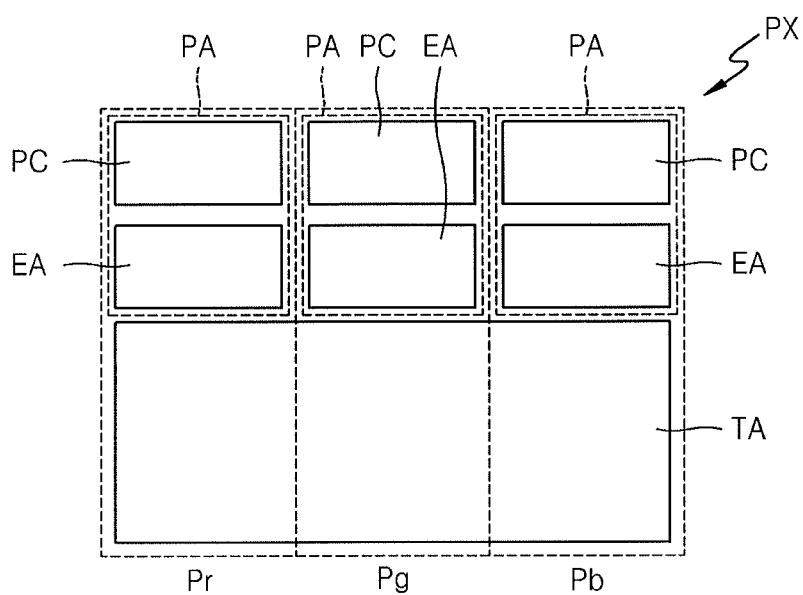

FIG. 4A is a diagram illustrating a configuration of a pixel PX of the organic light-emitting display device, according to an embodiment. FIG. 4B is a diagram illustrating a configuration of a pixel PX of an organic light-emitting display device, according to another embodiment.

Referring to FIGS. 4A and 4B, the pixel PX formed on the first substrate 1 includes a transmittance area TA via which external light is transmitted, and a pixel area PA that is adjacent to the transmittance area TA. In more detail, the pixel PX may include a plurality of sub-pixels Pr, Pg, and Pb. Each of the sub-pixels Pr, Pg, and Pb includes the pixel area PA and the transmittance area TA, and the pixel areas PA of the sub-pixels Pr, Pg, and Pb included in the pixel PX emit different types of light. For example, the pixel area PA of the first sub-pixel Pr emits red light R, the pixel area PA of the second sub-pixel Pg emits green light G, and the pixel area PA of the third sub-pixel Pb emits blue light B.

As illustrated in FIG. 4A, according to the present embodiment, the transmittance area TA may be independently formed for each of the sub-pixels Pr, Pg, and Pb. However, according to another embodiment, as illustrated in FIG. 4B, the transmittance area TA may be commonly formed while extending over the sub-pixels Pr, Pg, and Pb. That is, the pixel PX may include the transmittance area TA, and the pixel areas PA that are separate from each other by having the transmittance area TA therebetween.

The pixel area PA includes a pixel circuit unit PC including one or more thin film transistors (TFTs) TR1 and TR2, and a plurality of conductive lines including a scan line S, a data line D, and a VDD line V are electrically connected to the pixel circuit unit PC. Although not illustrated in FIGS. 4A and 4B, according to a configuration of the pixel circuit unit PC, in addition to the scan line S, the data line D, and the VDD line V that delivers a driving power, various conductive lines may be further arranged.

The pixel circuit unit PC includes the first TFT TR1 connected to the scan line S and the data line D, the second TFT TR2 connected to the first TFT TR1 and the VDD line V, and a capacitor Cst connected to the first TFT TR1 and the second TFT TR2. Here, the first TFT TR1 becomes a switching transistor, and the second TFT TR2 becomes a driving transistor. The second TFT TR2 is electrically connected to a first electrode 221. The first TFT TR1 and the second TFT TR2 may be formed as a P-type or an N-type.

The number of TFTs and capacitors is not limited to the aforementioned number according to the present embodiment, and according to other configurations of the pixel circuit unit PC, two or more TFTs and one or more capacitors may be combined.

The pixel area PA includes a light-emission unit EA emitting light, and the light-emission unit EA is electrically connected to the pixel circuit unit PC. Referring to FIGS. 4A and 4B, the light-emission unit EA does not overlap with the pixel circuit unit PC but is adjacent to it.

According to the present embodiment, in order to implement interactive media, the optical pattern array 3 is formed to correspond to the transmittance area TA. Hereinafter, a case in which a transmittance pattern OP is formed to correspond to a transmittance area TA will be described in detail with reference to FIG. 5. A case in which a light-blocking pattern CP is formed to correspond to a transmittance area TA will be described in detail with reference to FIGS. 6 through 8.

Figure 6:
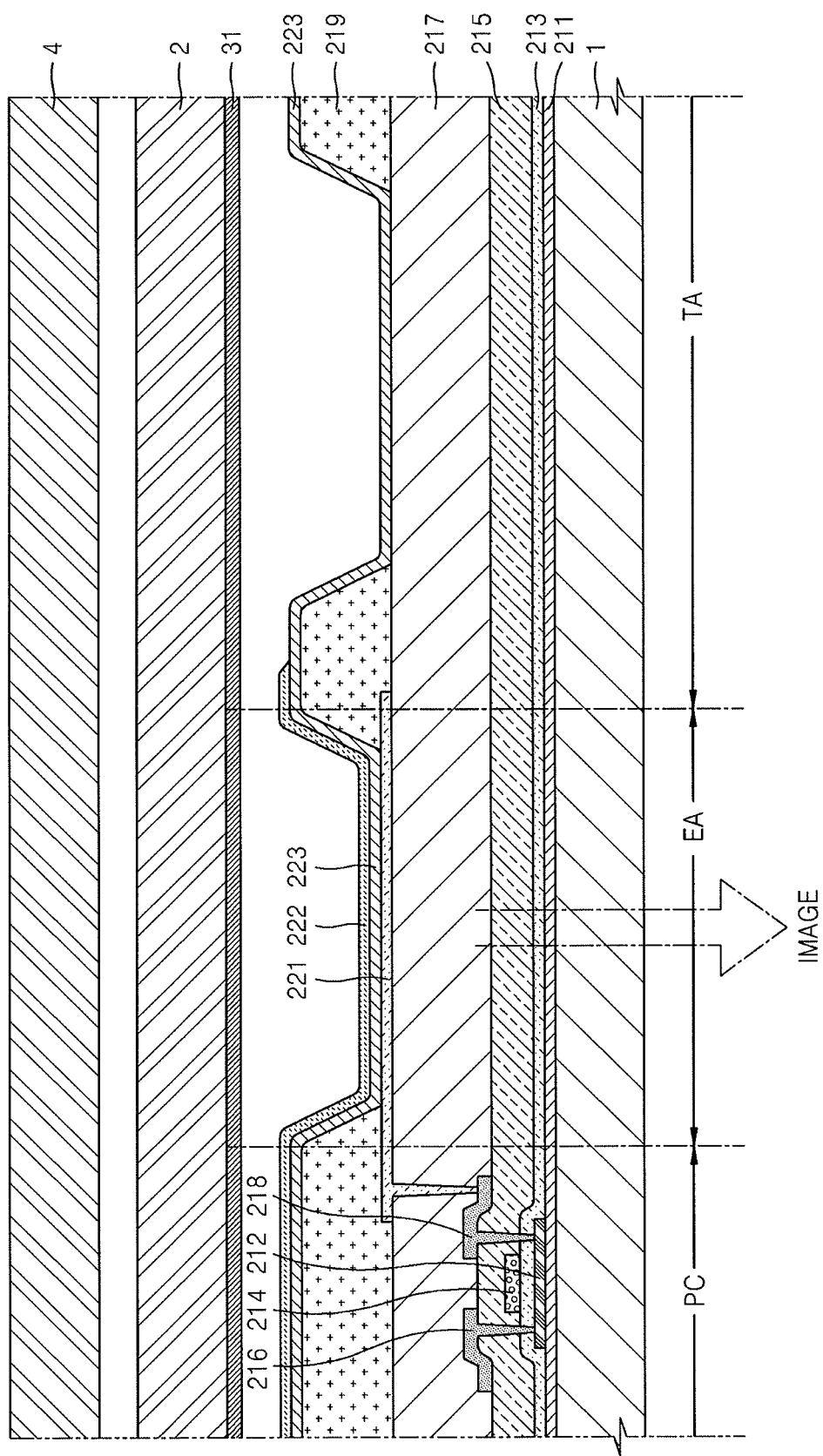
Figure 7:
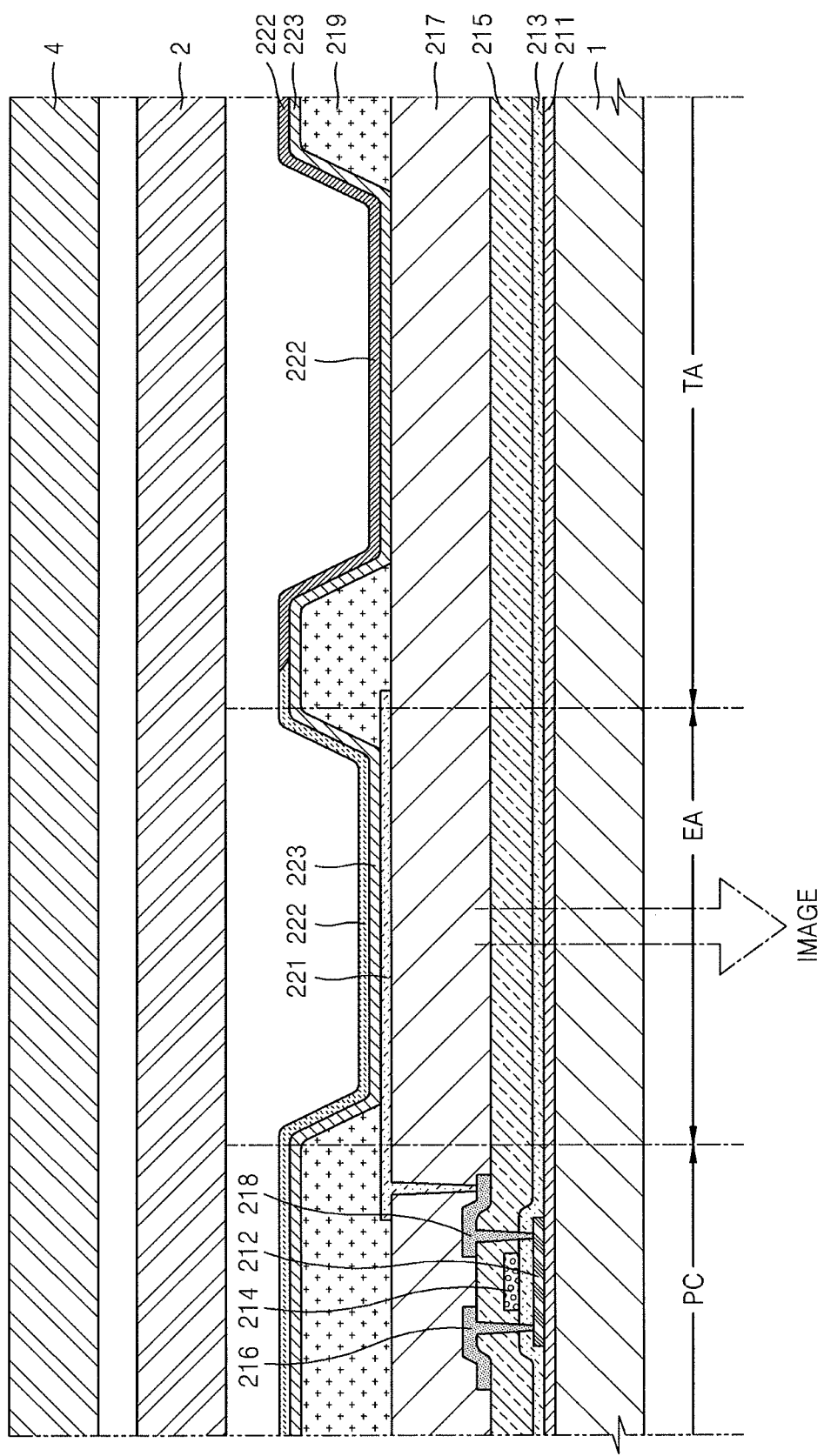

FIGS. 5 through 7 are cross-sectional views of the organic light-emitting display device of FIG. 4A, taken along a line I-I'. FIGS. 5 through 7 also illustrate configurations of a second substrate 2 and a sensor array 4 that are not illustrated in FIGS. 4A and 4B.

FIG. 5 illustrates a case in which the transmittance pattern OP is formed to correspond to the transmittance area TA, according to an embodiment.

Referring to FIG. 5, the second TFT TR2 is formed on a first substrate 1 and has a structure in which a buffer layer 211 is formed to prevent penetration of moisture, and an active layer 212, a gate insulating layer 213, a gate electrode 214, an interlayer insulating layer 215, and source and drain electrodes 216 and 218 are sequentially formed on the buffer layer 211. The second TFT TR2 is included in the pixel circuit unit PC. Next, a passivation layer 217 that is an insulating layer is formed to completely cover the pixel circuit unit PC and the transmittance area TA.

A first electrode 221 that is transparent and that is electrically connected to the second TFT TR2 of the pixel circuit unit PC is formed on the passivation layer 217. In particular, the first electrode 221 is included in the light-emission unit EA. Here, the first electrode 221 includes a transparent conductive material. For example, the first electrode 221 may be formed as ITO, IZO, ZnO, or $In_2O_3$, which has a high work function. In this case, the first electrode 221 functions as an anode.

Reference numeral 219 of FIG. 5 is a pixel defining layer (PDL) 219 that covers side portions of the first electrode 221 and exposes a center portion of the first electrode 221. The PDL 219 may cover the pixel area PA. In this regard, it is not necessary for the PDL 219 to completely cover the pixel area PA. Thus, it is sufficient for the PDL 219 to cover at least a portion of the pixel area PA, i.e., side portions of the pixel area PA.

A second electrode 222 faces the first electrode 221 and is formed in the light-emission unit EA. The second electrode 222 is formed of a material capable of reflecting light so as to emit the light toward the first electrode 221. For example, the second electrode 222 may include at least one metal of Ag, Mg, Al, Pt, Pd, Au, Ni, Nd, Ir, Cr, Li, Ca, Yb, and alloys thereof. In this case, the second electrode 222 functions as a cathode.

The second electrode 222 may extend over the entire pixel area PA so as to cover both the light-emission unit EA and the pixel circuit unit PC. However, the second electrode 222 is not formed in the transmittance area TA. By doing so, external light may be transmitted to the sensor array 4 from the transmittance area TA. Due to the aforementioned configurations of the first electrode 221 and the second electrode 222, in the organic light-emitting display device of FIG. 5, light is emitted to the first electrode 221 that is toward a bottom side.

An organic layer 223 is interposed between the first electrode 221 and the second electrode 222, and includes an emission layer (EML). The organic layer 223 may be formed as a small-molecule organic layer or a polymer organic layer. When the organic layer 223 is formed as the small-molecule organic layer, the organic layer 223 may have a structure in which a Hole Injection Layer (HIL), a Hole Transport Layer (HTL), an EML, an Electron Transport Layer (ETL), an Electron Injection Layer (EIL) or the like are singularly or multiply stacked, and may be formed by using one of various organic materials including copper phthalocyanine (CuPc), N,N'-Di(naphthalene-1-yl)-N,N'-diphenyl-benzidine (NPB), tris-8-hydroxyquinoline aluminum)(Alq3), etc. The small-molecule organic layer may be formed by using a vacuum deposition method.

The second substrate 2 is formed above the first substrate 1 so as to encapsulate the pixel area PA and the transmittance area TA. Here, the second substrate 2 may be formed of a transparent material, and may have a substrate shape or a sheet shape.

The sensor array 4 is disposed near to the second substrate 2. That is, the sensor array 4 is disposed at a top side that is away from the occurrence of light emission.

Referring to the pixel PX of FIG. 5, in order to allow the sensor array 4 corresponding to the transmittance area TA of the pixel PX to receive external light, a structure that blocks transmission of the external light is not formed in the transmittance area TA. In other words, the optical pattern array 3 corresponding to the pixel PX of FIG. 5 corresponds to the transmittance pattern OP.

On the other hand, FIG. 6 illustrates a case in which the light-blocking pattern CP is formed to correspond to the transmittance area TA, according to another embodiment.

Unlike the case of FIG. 5, FIG. 6 is characterized such that a light-blocking layer 31 is formed on one surface of a second substrate 2. In the case of FIG. 6, the light-blocking layer 31 is formed on the surface of the second substrate 2 facing a first substrate 1. However, according to one or more embodiments, the light-blocking layer 31 may be formed on the other surface of the second substrate 2, which is away from the first substrate 1. While it is sufficient for the light-blocking layer 31 to cover only the transmittance area TA, it is also possible for the light-blocking layer 31 to be formed in both of the pixel area PA and the transmittance area TA so as to completely cover the pixel PX.

The light-blocking layer 31 may be formed of a material capable of reflecting or blocking light, and for example, the light-blocking layer 31 may include at least one metal of Ag, Mg, Al, Pt, Pd, Au, Ni, Nd, Ir, Cr, Li, Ca, Mo, and alloys thereof or may include a black matrix material.

According to the present embodiment, the optical pattern array 3 corresponding to the pixel PX of FIG. 6 includes the light-blocking layer 31 so that external light is not transmitted via the transmittance area TA. Thus, the optical pattern array 3 is the light-blocking pattern CP that cannot deliver light to the sensor array 4 corresponding to the pixel PX.

Figure 8:
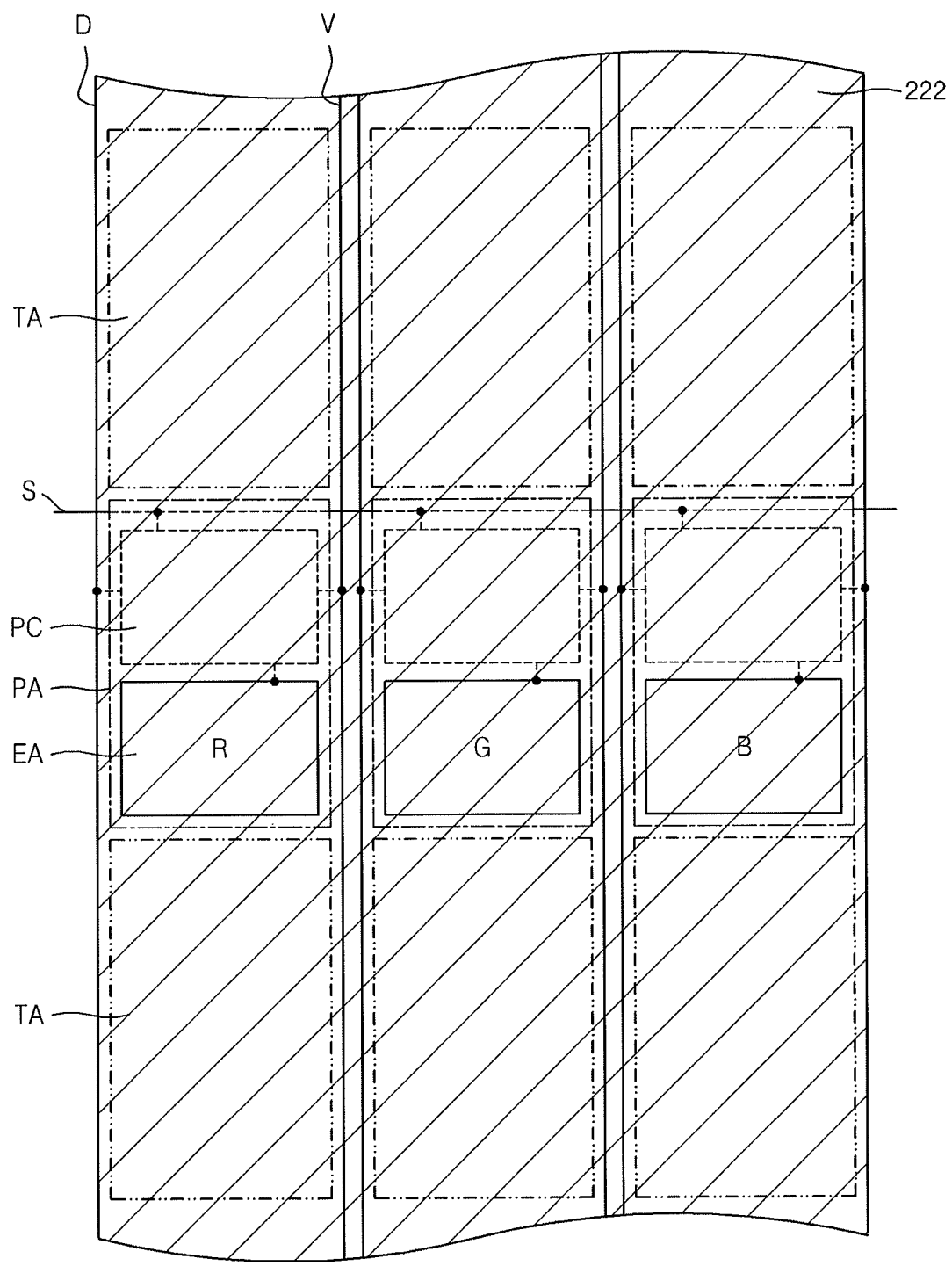
FIG. 8 is a plane view of a light-blocking pattern of FIG. 7.

FIG. 7 is a cross-sectional view illustrating another example of the light-blocking pattern CP of FIGS. 4A and 4B which is different from that of FIG. 6, according to another embodiment. FIG. 8 is a plane view of the light-blocking pattern CP of FIG. 7.

Unlike the embodiment of FIG. 6, the present embodiment of FIG. 7 is characterized in that the light-blocking layer 31 is not formed on a second substrate 2, but instead, a second electrode 222 capable of reflecting light extends over a transmittance area TA. In other words, as illustrated in FIG. 8, the second electrode 222 is formed to completely cover a pixel area PA and the transmittance area TA.

According to the present embodiment, the optical pattern array 3 that corresponds to the pixel PX of FIGS. 7 and 8 cannot transmit external light to the sensor array 4. Thus, similar to the embodiment of FIG. 6, the optical pattern array 3 of FIG. 7 is the light-blocking pattern CP that cannot deliver light to the sensor array 4 corresponding to the pixel PX.

Figure 9A:
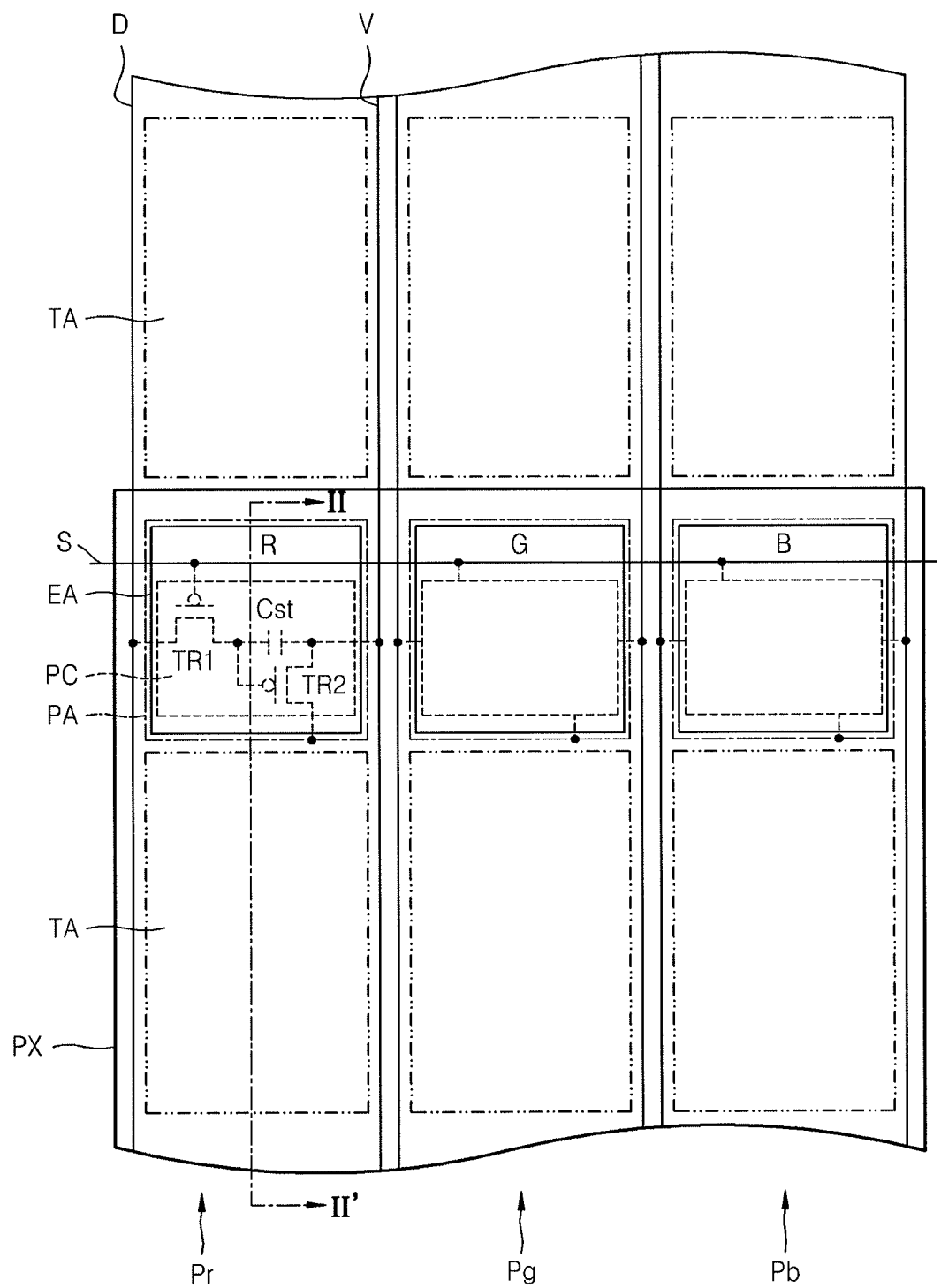
FIGS. 9A and 9B are diagrams illustrating configurations of a pixel of an organic light-emitting display device, according to another embodiment.
Figure 9B:
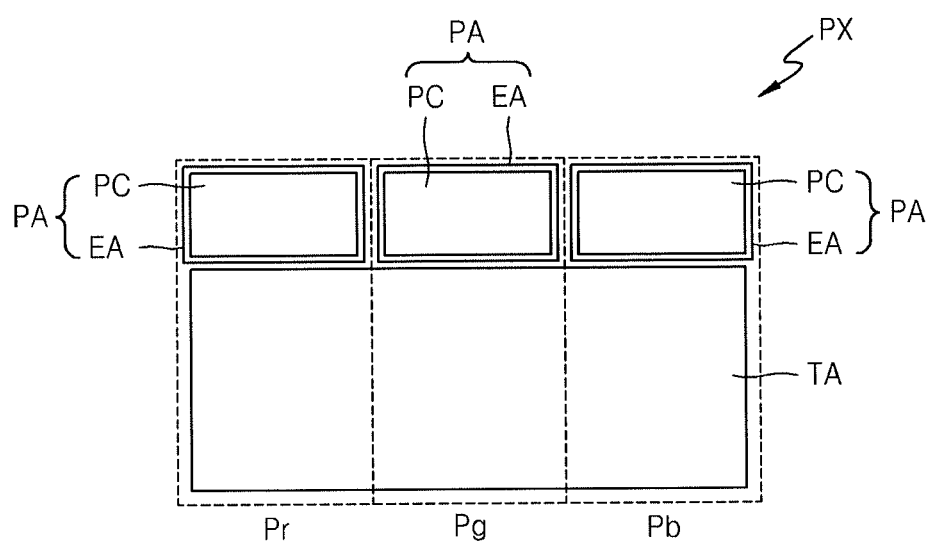

FIG. 9A is a diagram illustrating a configuration of a pixel PX of an organic light-emitting display device, according to another embodiment. FIG. 9B is a diagram illustrating a configuration of a pixel PX of an organic light-emitting display device, according to another embodiment.

Referring to FIG. 9A, the pixel PX formed on a first substrate 1 includes a transmittance area TA that transmits external light, and a pixel area PA that is adjacent to the transmittance area TA. Here, similar to the pixel area PA, the transmittance area TA may be independently formed for each of a plurality of sub-pixels Pr, Pg, and Pb. However, referring to the other embodiment of FIG. 9B, the transmittance area TA may be commonly formed while extending over the sub-pixels Pr, Pg, and Pb. The pixel areas PA of the sub-pixels Pr, Pg, and Pb included in the pixel PX emit different types of light. For example, the pixel area PA of the first sub-pixel Pr emits red light R, the pixel area PA of the second sub-pixel Pg emits green light G, and the pixel area PA of the third sub-pixel Pb emits blue light B.

The pixel area PA includes a pixel circuit unit PC including one or more TFTs TR1 and TR2, and a plurality of conductive lines including a scan line S, a data line D, and a VDD line V are electrically connected to the pixel circuit unit PC. Although not illustrated in FIGS. 9A and 9B, according to a configuration of the pixel circuit unit PC, in addition to the scan line S, the data line D, and the VDD line V that delivers a driving power, various conductive lines may be further arranged.

The pixel circuit unit PC includes the first TFT TR1 connected to the scan line S and the data line D, the second TFT TR2 connected to the first TFT TR1 and the VDD line V, and a capacitor Cst connected to the first TFT TR1 and the second TFT TR2. Here, the first TFT TR1 becomes a switching transistor, and the second TFT TR2 becomes a driving transistor. The second TFT TR2 is electrically connected to a first electrode 221. The first TFT TR1 and the second TFT TR2 may be formed as a P-type or an N-type. The number of TFTs and capacitors is not limited to the aforementioned number according to the present embodiment, and according to other configurations of the pixel circuit unit PC, two or more TFTs and one or more capacitors may be combined.

The pixel area PA includes a light-emission unit EA emitting light, and the light-emission unit EA is electrically connected to the pixel circuit unit PC. Unlike the embodiments of FIGS. 4A and 4B, referring to the embodiments of FIGS. 9A and 9B, the light-emission unit EA overlaps with the pixel circuit unit PC so as to cover the pixel circuit unit PC.

According to the present embodiment, in order to implement interactive media, an optical pattern array 3 is formed to correspond to the transmittance area TA. Hereinafter, a case in which a transmittance pattern OP is formed to correspond to a transmittance area TA will be described in detail with reference to FIG. 10, and a case in which a light-blocking pattern CP is formed to correspond to a transmittance area TA will be described in detail with reference to FIGS. 11 and 12.

Figure 10:
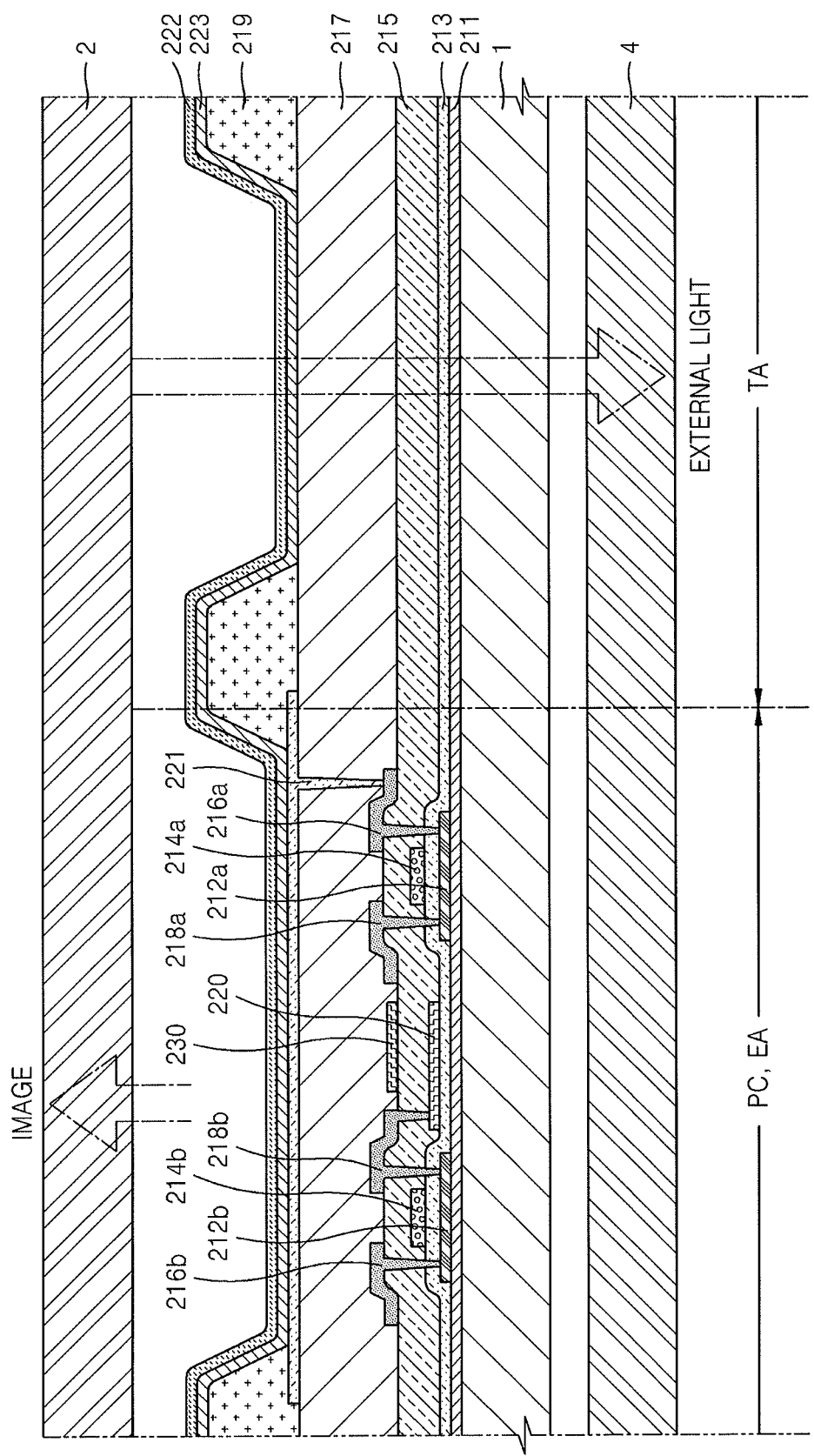
FIGS. 10 and 11 are cross-sectional views of the organic light-emitting display device of FIG. 9A, taken along a line II-II'.
Figure 11:
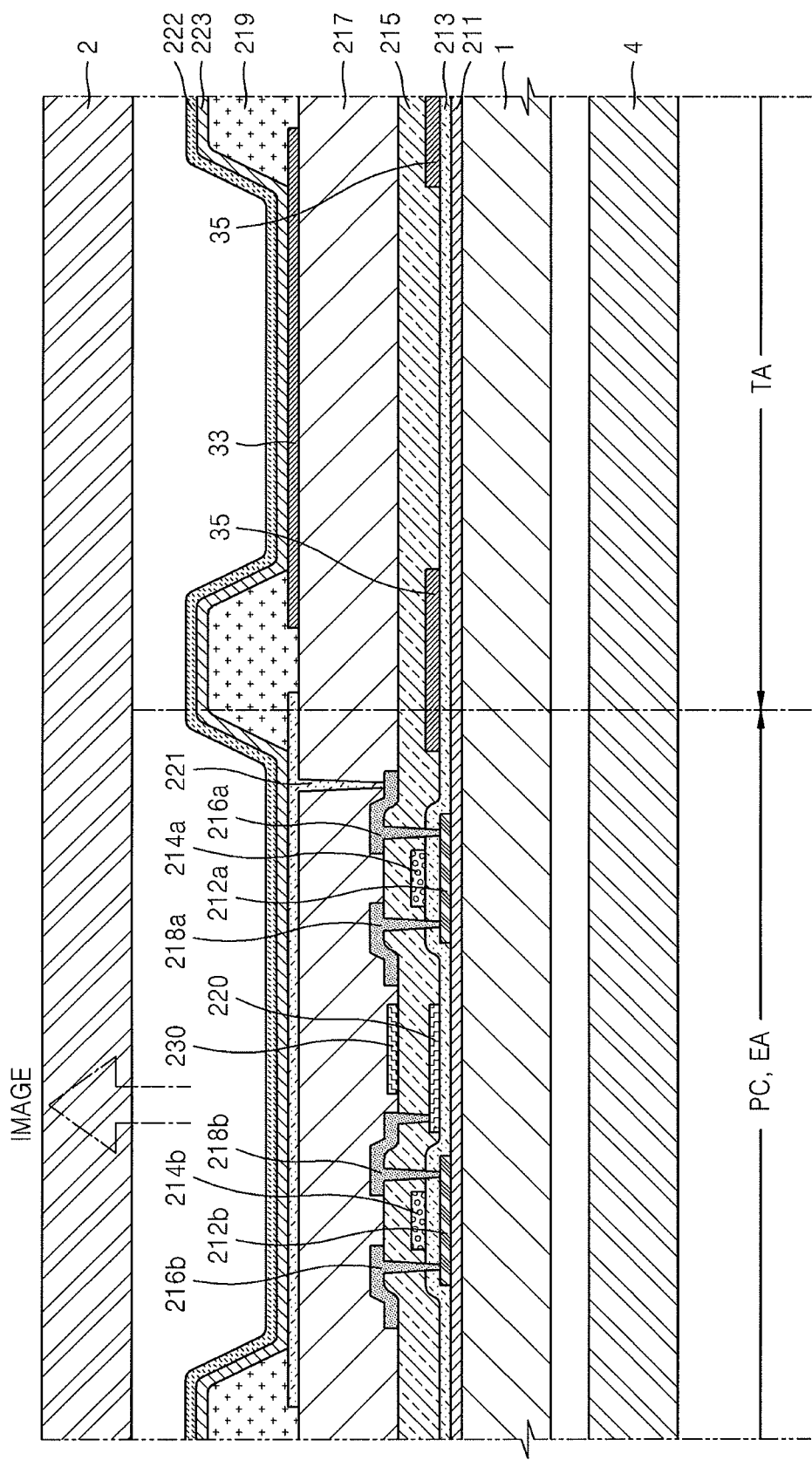

FIGS. 10 and 11 are cross-sectional views of the organic light-emitting display device of FIG. 9A, taken along a line FIGS. 10 and 11 also illustrate configurations of a second substrate 2 and a sensor array 4 that are not illustrated in FIGS. 9A and 9B.

First, FIG. 10 illustrates a case in which the transmittance pattern OP is formed to correspond to the transmittance area TA.

Referring to FIG. 10, the first and second TFTs TR1 and TR2 are formed on a first substrate 1 and have structures in which a buffer layer 211 is formed to prevent penetration of moisture, and an active layer 212, a gate insulating layer 213, a gate electrode 214, an interlayer insulating layer 215, and source and drain electrodes 216 and 218 are sequentially formed on the buffer layer 211. Also, FIG. 10 further illustrates the capacitor Cst formed on the gate insulating layer 213. Here, the capacitor Cst includes a lower electrode 220, an upper electrode 230, and an interlayer insulating 215 interposed between the lower electrode 220 and the upper electrode 230. The first and second TFTs TR1 and TR2, and the capacitor Cst are included in the pixel circuit unit PC. Next, a passivation layer 217 that is an insulating layer is formed to completely cover the pixel circuit unit PC and the transmittance area TA.

A first electrode 221 that is electrically connected to the second TFT TR2 of the pixel circuit unit PC and that includes a reflective layer capable of reflecting light is formed on the passivation layer 217. Here, the first electrode 221 has a multi-layer structure of a transparent conductive layer and the reflective layer. Here, the transparent conductive layer may be formed of ITO, IZO, ZnO, or $In_2O_3$, which has a high work function. Here, the reflective layer may include at least one metal of Ag, Mg, Al, Pt, Pd, Au, Ni, Nd, Ir, Cr, Li, Ca, Mo, and alloys thereof. The first electrode 221 may be formed only in the light-emission unit EA. In this case, the first electrode 221 functions as an anode.

Reference numeral 219 of FIG. 10 is a PDL 219 that covers side portions of the first electrode 221 and exposes a center portion of the first electrode 221. The PDL 219 may cover the pixel area PA and in this regard, it is not necessary for the PDL 219 to completely cover the pixel area PA. Thus, it is sufficient for the PDL 219 to cover at least a portion of the pixel area PA, i.e., side portions of the pixel area PA.

A second electrode 222 faces the first electrode 221 and is formed in the light-emission unit EA. The second electrode 222 is formed to be light-transmitting so as to emit light in a direction of the second electrode 222. For example, the second electrode 222 may be formed of metal having a small work function, e.g., Ag, Mg, Al, Pt, Pd, Au, Ni, Nd, Ir, Cr, Li, Ca, Yb, or alloys thereof. Here, the second electrode 222 may be formed as a thin film having a thickness in the range of 100 to 300 Å so as to have high transmittance. In this manner, the second electrode 222 is formed as a semi-transmissive and semi-reflective layer to be light-transmitting, so that the organic light-emitting display device is formed as a top-emission organic light-emitting display device. In this case, the second electrode 222 functions as a cathode.

The second electrode 222 may be formed not only in the pixel area PA but also in the transmittance area TA. According to the present embodiment, the second electrode 222 is formed as the thin film, so that, although the second electrode 222 is formed in the transmittance area TA, external light may pass through the second electrode 222. Due to the aforementioned configurations of the first electrode 221 and the second electrode 222, in the organic light-emitting display device of FIG. 10, light is emitted to the second electrode 222 that is toward a top side.

An organic layer 223 is interposed between the first electrode 221 and the second electrode 222, and includes an EML. The organic layer 223 may be formed as a small-molecule organic layer or a polymer organic layer.

The second substrate 2 is formed to encapsulate the pixel area PA and the transmittance area TA formed on the first substrate 1. Here, the second substrate 2 may be formed of a transparent material, and may have a substrate shape or a sheet shape.

The sensor array 4 is disposed near to the first substrate 1. That is, the sensor array 4 is disposed at a bottom side that is away from the occurrence of light emission.

Referring to the pixel PX of FIG. 10, in order to allow the sensor array 4 corresponding to the transmittance area TA of the pixel PX to receive external light, a structure that blocks transmission of the external light is not formed in the transmittance area TA. In other words, the optical pattern array 3 corresponding to the pixel PX of FIG. 5 corresponds to the transmittance pattern OP.

Figure 12:
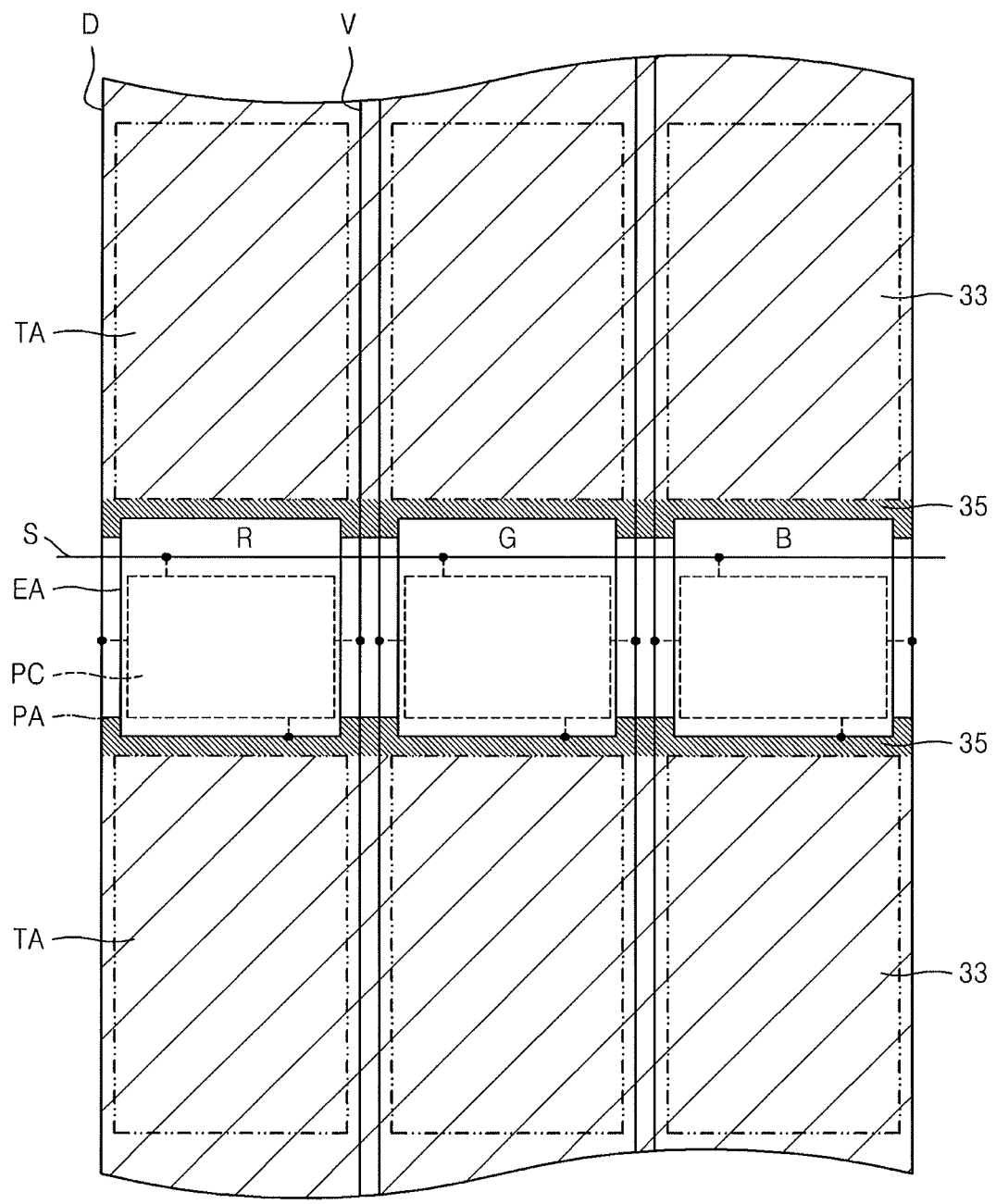
FIG. 12 illustrates a plane view of the organic light-emitting display device of FIG. 11.

On the other hand, FIG. 11 illustrates a case in which the light-blocking pattern CP is formed to correspond to the transmittance area TA, according to another embodiment. FIG. 12 illustrates a plane view of the organic light-emitting display device of FIG. 11.

Unlike the case of FIG. 10, FIG. 11 is characterized such that light-blocking layers 33 and 35 are formed on an insulating layer formed in the transmittance area TA. However, according to one or more embodiments, the light-blocking layers 33 and 35 may be formed on one surface of the first substrate 1 which corresponds to the transmittance area TA, or may be formed on the other surface of the first substrate 1. While it is sufficient for the light-blocking layers 33 and 35 to cover only the transmittance area TA, it is also possible for the light-blocking layers 33 and 35 to be formed in both the pixel area PA and the transmittance area TA so as to completely cover the pixel PX.

In the organic light-emitting display device of FIG. 11, the first light-blocking layer 33 is formed on the passivation layer 217 corresponding to the transmittance area TA, and the second light-blocking layer 35 is formed on the gate insulating layer 213 corresponding to an area between the transmittance area TA and the pixel area PA. In other words, referring to FIG. 11, the light-blocking layer 33 formed on the same layer as the first electrode 221 cannot completely block external light escaping through a space between the first electrode 221 and the first light-blocking layer 33, and external light escaping through a space between the first light-blocking layer 33 and the first electrode 221 of an adjacent pixel. Thus, the second light-blocking layer 35 is used. Referring to FIG. 12, external light cannot pass through the transmittance area TA due to the first and second light-blocking layers 33 and 35.

The light-blocking layers 33 and 35 may be formed of a material capable of reflecting or blocking light, and for example, the light-blocking layer 31 may include at least one metal of Ag, Mg, Al, Pt, Pd, Au, Ni, Nd, Ir, Cr, Li, Ca, Mo, and alloys thereof or may include a black matrix material.

According to the present embodiment, the optical pattern array 3 corresponding to the pixel PX of FIGS. 11 and 12 includes the light-blocking layers 33 and 35 so that transmittance of external light is partially impossible in the transmittance area TA. Thus, the optical pattern array 3 of FIGS. 11 and 12 is the light-blocking pattern CP that cannot deliver light to the sensor array 4 corresponding to the pixel PX.

In the present embodiment, the insulating layer may be formed of a transparent material so as to increase transmittance of the transmittance area TA. Here, the insulating layer may indicate the passivation layer 217. However, the one or more embodiments are not limited thereto. Thus, all of the interlayer insulating layer 215, the gate insulating layer 213, and the buffer layer 211 may be formed of a transparent material, whereby transmittance of the organic light-emitting display device may be further increased.

In addition, in order to further increase the transmittance of the transmittance area TA and to prevent optical interference due to transparent insulating layers in the transmittance area TA, and color purity deterioration and color change due to the optical interference, an opening may be formed in some of the insulating layers corresponding to the transmittance area TA.

For example, the opening may be formed in the PDL 219 covering the pixel circuit unit PC. However, the one or more embodiments are not limited thereto. Thus, openings connected to the opening of the PDL 219 may be further formed in one or more of the passivation layer 217, the interlayer insulating layer 215, the gate insulating layer 213, and the buffer layer 211, so that transmittance in the opening may be further increased.

By way of summation and review, a display device has to include an optical mask and a sensor array to capture a gesture. The optical mask has a coded optical pattern so as to extract three-dimensional (3D) data by analyzing the captured gesture. In order to implement an interactive media by using a display device, i.e., a liquid crystal display (LCD) device may need to perform time-division switching between a display mode (implementation of a display image, and switching a backlight ON), and a capture mode (implementation of an optical mask pattern, and switching the backlight OFF). Thus, as a result of time-division switching, brightness of the display image deteriorates, and a structural interference occurs between the backlight and the sensor array.

In contrast, embodiments are directed to an organic light-emitting display device having a coded optical pattern array directly formed thereon. According to one or more embodiments, the coded optical pattern array is directly formed on a transparent panel of the organic light-emitting display device. Thus, it is not necessary to display a separate optical mask pattern. In the embodiments, since a backlight is not used, interactive media may be implemented that is slim, large, and free from structural interference.

According to one or more embodiments, by implementing the interactive media in the organic light-emitting display device having a transmittance area, a display device may display an image and simultaneously capture a gesture of a user by the transmittance area. Thus, it is not necessary to perform time-division switching between a display mode and a capture mode as in the related art.

Exemplary embodiments have been disclosed herein, and although specific terms are employed, they are used and are to be interpreted in a generic and descriptive sense only and not for purpose of limitation.

What is claimed is:

1. An organic light-emitting display device, comprising:
   a substrate including a plurality of pixel areas arranged in an n-by-m array to display an image where n and m are positive integers greater than 2, and a transmittance area that is adjacent to at least one pixel area;
   a light sensor facing a second surface of the substrate, which is in a direction opposite to a first side of the substrate from which an image is emitted, the light sensor to sense external light received from a source external from the organic light-emitting display device and transmitted through the substrate in the transmittance area; and
   a pixel defining layer disposed on the substrate, the pixel defining layer including a first opening which overlaps one of the plurality of pixel areas, and a second opening which overlaps the transmittance area in plan view, wherein
   each pixel area includes, disposed on the substrate, an anode, a cathode, and an emission layer interposed between the anode and the cathode,
   each pixel area further includes a thin-film transistor disposed between the substrate and the pixel defining layer, the thin-film transistor configured to drive current through the emission layer, the thin-film transistor including an active layer, a source electrode connected to the active layer, and a drain electrode connected to the active layer,
   the cathode partially, but not entirely, overlaps the transmittance area in plan view,
   wherein one of the plurality of pixel areas emits a color different from that of an other one of the plurality of pixel areas, and
   there is no semiconductor layer between the substrate and the second opening in a thickness direction.

2. The organic light-emitting display device of claim 1, wherein at least two pixel areas are separate from each other by having the transmittance area therebetween.

3. The organic light-emitting display device of claim 2, wherein the substrate is disposed below the active layer of the thin-film transistor.

4. The organic light-emitting display device of claim 1, further comprising
   a light-blocking layer, wherein
   the light-blocking layer includes a portion that covers the transmittance area.

5. The organic light-emitting display device as claimed in claim 4, wherein the light-blocking layer is disposed between the light sensor and the cathode.

6. The organic light-emitting display device as claimed in claim 5, wherein
   the thin-film transistor is connected to the anode,
   the thin-film transistor further includes a gate insulating layer, a gate electrode, and an interlayer insulating layer disposed on the gate electrode, and
   the light-blocking layer is disposed between the light sensor and the source and drain electrodes in the thickness direction.

7. The organic light-emitting display device as claimed in claim 4, wherein the light-blocking layer includes at least one metal of Ag, Mg, Al, Pt, Pd, Au, Ni, Nd, Ir, Cr, Li, Ca, Mo, and alloys thereof or includes a black matrix material.

8. The organic light-emitting display device as claimed in claim 1, wherein the light sensor includes a charge-coupled device (CCD) sensor or a complementary metal-oxide-semiconductor (CMOS) sensor.

9. The organic light-emitting display device of claim 1, wherein the substrate is below the active layer of the thin-film transistor.

10. The organic light-emitting display device of claim 1, wherein the organic light-emitting display device includes a coded optical pattern formed on a transparent panel, and the light sensor is an array sensor to sense light external from the organic light-emitting display device, wherein the light sensor and the coded optical pattern are together capable to sense a gesture external to the light-emitting display device such that the sensed gesture is capable of being analyzed to extract three-dimensional (3D) information of the sensed gesture.

11. The organic light-emitting display device of claim 1, wherein the display device displays an image and simultaneously captures a gesture of a user via the transmittance area.

12. The organic light-emitting display device of claim 1, wherein the transmittance area overlaps the emission layer in a plan view and the transmittance area is substantially not covered by the cathode.

13. The organic light-emitting display device of claim 1, wherein the transmittance area overlaps a bottom of a depression between edges of the pixel defining layer in plan view.

14. The organic light-emitting display device of claim 1, wherein the transmittance area further does not overlap the source electrode or the drain electrode in plan view.

15. An organic light-emitting display device, comprising:
a substrate including a plurality of pixel areas arranged in an n-by-m array to display an image where n and m are positive integers greater than 2, and a transmittance area that is adjacent to at least one pixel area;
a light sensor disposed above the substrate, the light sensor to sense external light received from a source external from the organic light-emitting display device and transmitted through the substrate in the transmittance area; and
a pixel defining layer disposed on the substrate, the pixel defining layer including a first opening which overlaps one of the plurality of pixel areas, and a second opening which overlaps the transmittance area in plan view, wherein
each pixel area includes, disposed on the substrate, an anode, a cathode, and an emission layer interposed between the anode and the cathode,
each pixel area further includes a transistor disposed between the substrate and the pixel defining layer, the transistor configured to drive current through the emission layer, the transistor including an active layer, a source electrode connected to the active layer, and a drain electrode connected to the active layer,
the cathode does not entirely overlap the transmittance area in plan view,
the emission layer overlaps the light sensor in plan view,
wherein one of the plurality of pixel areas emits a color different from that of an other one of the plurality of pixel areas, and
there is no semiconductor layer between the substrate and the second opening in a thickness direction.

16. The organic light-emitting display device of claim 15, wherein the transmittance area overlaps a bottom of a depression between edges of the pixel defining layer in plan view.

17. An organic light-emitting display device, comprising:
a substrate including a plurality of pixel areas to display an image, and a transmittance area that is adjacent to at least one pixel area,
a light sensor disposed above the substrate, the light sensor to sense external light received from a source external from the organic light-emitting display device and transmitted through the substrate in the transmittance area; and
a pixel defining layer disposed on the substrate, the pixel defining layer including a first opening which overlaps one of the plurality of pixel areas, and a second opening which overlaps the transmittance area in plan view, wherein
each pixel area includes, disposed on the substrate, an anode, a cathode, and an emission layer interposed between the anode and the cathode,
each pixel area further includes a transistor disposed between the substrate and the pixel defining layer, the transistor configured to drive current through the emission layer, the transistor including an active layer, a source electrode connected to the active layer, and a drain electrode connected to the active layer,
an edge of the cathode is on a portion of the pixel defining layer that covers side portions of the anode and exposes a center portion of the anode,
the substrate is disposed below the active layer of the transistor,
at least one insulating layer is in the transmittance area, and
there is no semiconductor layer between the substrate and the second opening in a thickness direction.

18. The organic light-emitting display device of claim 17, wherein the at least one insulating layer in the transmittance area overlaps the light sensor.

* * * * *